(12) United States Patent
Adler (10) Patent No.: US 8,729,470 B2
(45) Date of Patent: May 20, 2014

(54) ELECTRON MICROSCOPE WITH AN EMITTER OPERATING IN MEDIUM VACUUM

(75) Inventor: David L. Adler, San Jose, CA (US)

(73) Assignee: DLA Instruments, San Jose, CA (US)

( * ) Notice: Subject to any disclaimer, the term of this patent is extended or adjusted under 35 U.S.C. 154(b) by 346 days.

(21) Appl. No.: 12/653,812

(22) Filed: Dec. 21, 2009

(65) Prior Publication Data

US 2010/0314540 A1   Dec. 16, 2010

Related U.S. Application Data

(60) Provisional application No. 61/268,695, filed on Jun. 14, 2009.

(51) Int. Cl.
*H01J 37/28* (2006.01)

(52) U.S. Cl.
USPC .............................. 250/310; 250/307; 250/311

(58) Field of Classification Search
CPC .................................. H01J 37/28; G01N 23/00
USPC .......................................................... 250/310
See application file for complete search history.

(56) References Cited

U.S. PATENT DOCUMENTS

| | | | | |
|---|---|---|---|---|
| 3,273,005 A | * | 9/1966 | Lafferty | 313/346 R |
| 3,566,184 A | * | 2/1971 | Maskell | 315/111.81 |
| 4,594,554 A | * | 6/1986 | Schick | 327/538 |
| 4,680,087 A | * | 7/1987 | Bobbio | 438/707 |
| 5,097,126 A | | 3/1992 | Krivanek | 250/305 |
| 6,552,341 B1 | * | 4/2003 | Desplats et al. | 250/311 |
| 6,664,739 B1 | * | 12/2003 | Kishinevsky et al. | 315/111.41 |
| 6,930,313 B2 | | 8/2005 | Fujieda et al. | 250/423 R |
| 7,220,963 B2 | * | 5/2007 | Gross | 250/310 |
| 2004/0144922 A1 | * | 7/2004 | Hayashibara et al. | 250/310 |
| 2004/0238739 A1 | | 12/2004 | Gross | 250/310 |
| 2006/0290255 A1 | | 12/2006 | Yamaguchi et al. | 313/310 |
| 2007/0145267 A1 | | 6/2007 | Adler et al. | 250/310 |
| 2008/0169749 A1 | | 7/2008 | Kim et al. | 313/498 |

OTHER PUBLICATIONS

PCT International Search Report and Written Opinion, Mar. 8, 2011.
J.C. Batty et al., "Quasiequilibrium Treatment of Gas-Solid Reactions. III. Rate of Volatilization of Tungsten by High-Temperature Oxidation," Oxidation of Metals vol. 3, pp. 331-355 (1971).

(Continued)

*Primary Examiner* — Phillip A Johnston
(74) *Attorney, Agent, or Firm* — Steven Stupp (57) ABSTRACT

An electron microscope is described. This electron microscope includes an electron emitter that has an evaporation or sublimation rate that is significantly less than that of tungsten at the reduced pressures around the electron emitter during operation of the electron microscope. As a consequence, the electron microscope may be able to operate at reduced pressures that are much larger than those in existing electron microscopes. For example, at least during the operation the reduced pressure in the electron microscope may be greater than or equal to a medium vacuum. This capability may allow the electron microscope to use a roughing pump to provide the reduced pressure, thereby reducing the cost and complexity of the electron microscope, and improving its reliability. In addition, the size of the electron microscope may be reduced, which may enable a hand-held or portable version of the electron microscope.

20 Claims, 7 Drawing Sheets

(56) References Cited

OTHER PUBLICATIONS

F.J. Harvey, "High-Temperature Oxidation of Tungsten Wires in $O_2$-Ar Mixtures," Metallurgical Transactions vol. 4, pp. 1513-1517 (1973).

F.J. Harvey, "High-Temperature Oxidation of Tungsten Wires in Water Vapor-Argon Mixtures," Metallurgical Transactions vol. 5, pp. 1189-1192 (1974).

Keiji Yada, "A New Preparation Method for Refractory Carbides and Their Thermionic Emission Properties," J. Electron Microscopy vol. 31, pp. 349-359 (1982).

Keiji Yada, "Brightness Characteristics of Carbide Emitters for Electron Microscopy," J. Electron Microscopy vol. 34, pp. 147-155 (1985).

P.R. Davis et al., "The Effect of Oxygen Pressure on Volatility and Morphology of $LaB_6$ Single Crystal Cathodes," J. Vacuum Science Technology vol. 4, pp. 112-115 (1986).

Keiji Yada et al., "Studies of Refractory Carbides, Nitrides and Borides as the Thermionic Emitters in Electron Microscopy," J. of Electron Microscopy Technique vol. 12, pp. 252-261 (1989).

William A. Mackie et al., "Single-Crystal Zirconium Carbide as a High-Temperature Thermionic Cathode Material," IEEE Trans. on Electron Devices vol. 36, pp. 220-224 (1989).

"General Guidelines for Operating ES-423E $LaB_6$ Cathodes," Kimball Physics, Inc. (1991).

"The Relationship Between $LaB_6$ Cathode Life and Gun Vacuum," Kimball Physics, Inc. (1991).

"Kimball Physics ES-423E $LaB_6$ Cathode," Kimball Physics, Inc. (1991).

E.L. Courtright et al., "Oxidation of Hafnium Carbide and Hafnium Carbide with Additions of Tantalum and Praseodymium," Oxidation of Metals vol. 36, pp. 423-437 (1991).

Colleen M. Marrese et al., "The Design of a Cathode to Operate in an Oxygen-Rich Environment," American Institute of Physics Conference 970115, pp. 305-310 (1997).

Shiro Shimada et al., "Oxidation of Hafnium Carbide and Tantalum Carbide Single Crystals with the Formation of Carbon at High Temperatures and Low Oxygen Pressures," J. American Ceramic Society vol. 721-728 (2000).

Niels de Jonge et al., "High Brightness Electron Beam from a Multi-Walled Carbon Nanotube," Nature vol. 420, pp. 393-395 (2002).

A. Sayir, "Carbon Fiber Reinforced Hafnium Carbide Composite," J. of Material Science vol. 39, pp. 5995-6003 (2004).

E. Wuchina et al., "Designing for Ultra-High Temperature Applications: The Mechanical and Thermal Properties of $HfB_2$, $HfC_x$, $HfN_x$, and $\alpha HfN$," J. of Material Science vol. 39, pp. 5939-5949 (2004).

M.M. Opeka et al., "Oxidation-Based Materials Selection for 2000C+ Hypersonic Aerosurfaces: Theoretical Considerations and Historical Experience," J. of Material Science vol. 39, pp. 5887-5904 (2004).

E. Opila et al., "Oxidation of $ZfB_2$- and $HfB_2$-Based Ultra-High Temperature Ceramics: Effect of Ta Additions," J. of Material Science vol. 39, pp. 5969-5977 (2004).

W.A. Mackie et al., "Development of a (100) Hafnium Carbide Thermionic Electron Source with Built-in Guard Ring and Heater," IEEE, pp. 201-202 (2006).

Hiroshi Suga et al., "Stable Multiwalled Carbon Nanotube Electron Emitter Operating in Low Vacuum," Surface and Interface Analysis vol. 38, pp. 1763-1767 (2006).

Hiroshi Suga et al., "Stable Operating Condition of Carbon Nanotube Field Electron Emitter for Small Size Scanning Electron Microscope," J. Vacuum Society of Japan, vol. 50, No. 6, pp. 448-451 (2007).

E Wuchina et al., "UHTCs: Ultra-High Temperature Ceramic Materials for Extreme Environment Applications," The Electrochemical Society Interface pp. 30-36, Winter 2007.

Ryosuke Yabushita et al., "Development of Compact Field Emission Scanning Electron Microscope Equipped with Multiwalled Carbon Nanotube Bundled Cathode," J. Vacuum Science Technology vol. 25, pp. 640-642 (2007).

Toshio Fukuda et al., "Bringing the Nanolaboratory Inside Electron Microscopes," IEEE Nanotechnology Magazine, pp. 18-31, Jun. 2008.

"Tungsten Filaments: Hairpin Thermionic Emitters," Kimball Physics, Inc. (2008).

L. Reimer, "Image Formation in Low-Voltage Scanning Electron Microscopy," Tutorial Texts in Optical Engineering vol. TT 12, Donald C. O'Shea, editor (SPIE Optical Engineering Press, Washington, 1193), pp. 49-56.

* cited by examiner

┌─────────────────────────────────────────────────────────┐
│ POSITION A SAMPLE IN A CAVITY IN AN ELECTRON MICROSCOPE AND/OR │
│ CLOSE A DOOR TO A HOUSING IN THE ELECTRON MICROSCOPE    │
│ (OPTIONAL)                                              │
│ 610                                                     │
└─────────────────────────────────────────────────────────┘
                              ↓
┌─────────────────────────────────────────────────────────┐
│ PROVIDE REDUCED PRESSURE GREATER THAN OR EQUAL TO A MEDIUM │
│ VACUUM IN THE CAVITY THAT INCLUDES AN ELECTRON EMITTER AT LEAST │
│ DURING OPERATION OF THE ELECTRON MICROSCOPE             │
│ 612                                                     │
└─────────────────────────────────────────────────────────┘
                              ↓
┌─────────────────────────────────────────────────────────┐
│ GENERATE AN ELECTRON BEAM IN THE CAVITY USING THE ELECTRON │
│ EMITTER AT LEAST DURING THE OPERATION OF THE ELECTRON   │
│ MICROSCOPE                                              │
│ 614                                                     │
└─────────────────────────────────────────────────────────┘

POSITION AN OPENING OF A HOUSING IN AN ELECTRON MICROSCOPE, WHICH INCLUDES AN ELECTRON EMITTER WITHIN A CAVITY DEFINED AT LEAST IN PART BY A WALL OF THE HOUSING, OVER A SAMPLE, THEREBY MAKING AT LEAST A PARTIAL VACUUM SEAL WITH A SURFACE AROUND THE SAMPLE
710

↓

PROVIDE REDUCED PRESSURE IN THE CAVITY USING A VACUUM-GENERATING MECHANISM IN THE ELECTRON MICROSCOPE
(OPTIONAL)
712

↓

PROVIDE AN ELECTRON BEAM USING THE ELECTRON EMITTER, WHICH IMPINGES ON THE SAMPLE
714

FIG. 7

ELECTRON MICROSCOPE WITH AN EMITTER OPERATING IN MEDIUM VACUUM

CROSS REFERENCE TO RELATED APPLICATIONS

This application claims priority under 35 U.S.C. 119(e) to U.S. Provisional Application Ser. No. 61/268,695, entitled "Electron Microscope With Emitter Operating in Low Vacuum," by David L. Adler, filed on Jun. 14, 2009, the contents of which are herein incorporated by reference.

FIELD OF THE INVENTION

The present disclosure relates generally to an electron microscope and associated methods. More specifically, the present disclosure relates to an electron microscope with an emitter that can operate at a pressure greater than or equal to a medium vacuum.

BACKGROUND

Electron microscopes are widely used in micro-analysis because of their high depth of field and resolution. Typically, existing electron microscopes use electron-emitter materials that have a high evaporation or sublimation rate in environments that contain oxygen, such as tungsten or lanthanum hexaboride. Consequently, to extend the life of the electron emitter, during operation these existing electron microscopes usually maintain reduced pressures in the high to ultra-high vacuum region (for example, between $10^{-5}$ and $10^{-11}$ Torr) in a region around the electron emitter. Indeed, as the oxygen pressure in this region in existing electron microscopes is increased from $10^{-5}$ to $10^{-2}$ Torr, the lifetime of the electron emitter decreases from several hundred hours to less than one hour.

However, the vacuum pumps and associated hardware (such as valves) used to create and maintain such reduced pressures (such as turbo-molecular pumps or diffusion pumps) are expensive, can make existing electron microscopes difficult to use, and can increase the size and weight of the existing electron microscopes. These characteristics can limit the number of potential applications and users of electron microscopes.

Therefore, there is a need for an electron microscope without the problems listed above.

SUMMARY OF THE INVENTION

One embodiment of the present invention provides an electron microscope, which includes: an electron emitter, a housing (such as a column), and a vacuum-generating mechanism. At least during operation of the electron microscope, the electron emitter provides an electron beam. This electron emitter and the electron beam are at least partially enclosed within a cavity defined by an inside wall of the housing. Furthermore, the vacuum-generating mechanism, which is mechanically coupled to the housing, provides a reduced pressure greater than or equal to a medium vacuum in the cavity at least during the operation of the electron microscope. For example, the medium vacuum may include a pressure approximately greater than $10^{-4}$ Torr.

In some embodiments, the vacuum-generating mechanism includes a roughing pump. However, the vacuum-generating mechanism may exclude a turbo-molecular pump or a diffusion pump.

Furthermore, the electron emitter may have an evaporation or sublimation rate that is significantly less than that of tungsten at the reduced pressure, such as an evaporation or sublimation rate that is at least two orders of magnitude smaller. In some embodiments, the electron emitter is a ceramic, such as a carbide-based material. For example, the electron emitter may include: hafnium carbide, hafnium dioxide, hafnium diboride, zirconium carbide, zirconium dioxide, zirconium diboride, tantalum carbide and/or compounds that include two or more of these compounds. More generally, the electron emitter may include a material other than: tungsten, lanthanum hexaboride, a carbon nanotube (and, more generally, an allotrope of carbon) and/or cerium hexaboride.

In some embodiments, the electron microscope includes a filter to remove particulate matter from the cavity at least during the operation of the electron microscope. For example, the filter may include an electrostatic filter. Note that the filter may be replaceable.

Additionally, the electron microscope may be portable. For example, the electron microscope may be hand held. In some embodiments, the housing has an opening defined by an edge, and the electron microscope includes a seal (such as a sliding seal or an airbearing) that is mechanically coupled to the housing, which removeably mechanically couples the housing to a surface external to the electron microscope. This seal may facilitate displacement of the housing along the surface when the housing is mechanically coupled to the surface.

In some embodiments, the electron microscope may be operated using a removable power source, such as batteries.

In some embodiments, the vacuum is generated manually.

In some embodiments, the electron microscope includes a positioning stage that is mechanically coupled to the housing, which displaces a sample relative to the electron beam. Alternatively, the positioning stage may not displace the sample relative to the electron beam.

Furthermore, the electron microscope may include control logic that deactivates the vacuum-generating mechanism and/or the electron emitter during a standby operating mode, and that activates the vacuum-generating mechanism and/or the electron emitter during a normal operating mode.

Additionally, the electron microscope may include a valve (or a relay or another device) that selectively mechanically couples the vacuum-generating mechanism and the housing. The control logic may provide first control signals to the valve so that the valve selectively mechanically decouples the vacuum-generating mechanism and the housing and/or the sample during the standby operating mode. Then, during the normal operating mode, the control logic may provide second control signals to the valve so that the valve selectively mechanically couples the vacuum-generating mechanism and the housing and/or the sample.

Note that the electron microscope may be used in conjunction with another micro-analysis technique. For example, the other micro-analysis technique may include: energy dispersive x-ray analysis, optical imaging, optical microscopy, optical fluorescence imaging or spectroscopy, wavelength dispersive spectroscopy, x-ray diffraction analysis, x-ray fluorescence and/or electron-beam backscattered diffraction.

In some embodiments, the electron microscope includes an electro-optical mechanism that is external to the cavity, which scans, deflects, focuses and/or stigmates the electron beam. For example, the electro-optical mechanism may include: a magnetic deflection mechanism, an electron lens, a stigmator, a deflector and/or an alignment coil. Furthermore, the electron emitter may include an electrode that forms the electron beam.

Note that the electron microscope may include multiple electron emitters and associated housings, which facilitate faster imaging or writing. Additionally or separately, at least the electron emitter and/or the housing may be fabricated using a micro-electromechanical system (MEMS) fabrication technology.

Another embodiment provides an x-ray source that uses the electron beam provided by the electron microscope.

Another embodiment provides a method for generating the electron beam for use in the electron microscope. During this method, the reduced pressure greater than or equal to the medium vacuum is provided in the cavity that includes the electron emitter at least during the operation of the electron microscope. Then, the electron beam is generated in the cavity using the electron emitter at least during the operation of the electron microscope.

Another embodiment provides a method for using an electron microscope. During this method, the opening of the housing in the electron microscope, which includes the electron emitter within the cavity defined at least in part by the wall of the housing, is positioned over a sample, thereby making at least a partial vacuum seal with a surface around the sample. Then, the electron emitter provides an electron beam, which impinges on the sample.

Another embodiment provides a method for irradiating an object (such as food or a parcel) using the electron beam provided by the electron microscope, thereby sterilizing the object.

Another embodiment provides a method for inspecting an object (such as an airplane, a train, a bridge, or in failure analysis of a machine that is susceptible to stress fractures or cracks) or reviewing features on the object (which may be identified via another technique) using the electron beam provided by the electron microscope.

Another embodiment provides a method for imaging or irradiating at least a portion of an animal (such as a patient or a biological sample associated with the patient) using the electron beam provided by the electron microscope, thereby performing a diagnostic test or implementing a medical therapy.

Another embodiment provides a method for writing patterns onto a semiconductor wafer, a photo-mask, a MEMS substrate, a substrate for an optical device, or another substrate material during a lithographic process using the electron beam provided by the electron microscope.

BRIEF DESCRIPTION OF THE DRAWINGS

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Embodiments of an electron microscope, associated methods, and of an x-ray source are described. This electron microscope includes an electron emitter that has an evaporation or sublimation rate that is significantly less than that of tungsten or lanthanum hexaboride at the reduced pressures around the electron emitter during operation of the electron microscope. As a consequence, the electron microscope may be able to operate at reduced pressures that are much larger than those in existing electron microscopes. For example, at least during the operation the reduced pressure in the electron microscope may be greater than or equal to a medium vacuum.

This capability may allow the electron microscope to use a medium vacuum to provide the reduced pressure instead of a high-vacuum pump, thereby reducing the cost and complexity of the electron microscope, and improving its reliability and ease of use. For example, the cost of the electron microscope may be ten times less than existing electron microscopes. Furthermore, the electron microscope may be simpler to operate. In addition, the size and weight of the electron microscope may be reduced, which may enable a hand-held or portable version of the electron microscope. Consequently, the electron microscope may provide increased commercial success, and may allow the electron microscope to be used in additional applications.

Figure 1:
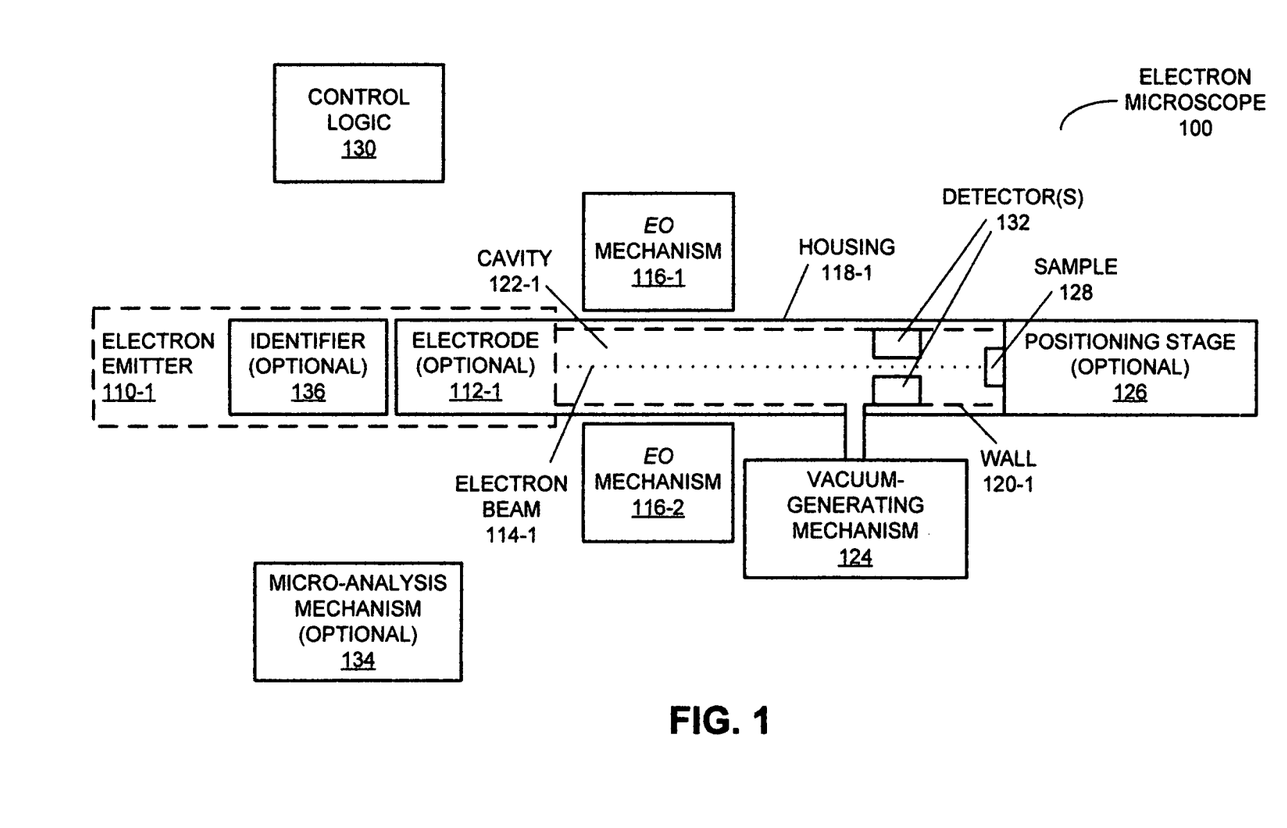
FIG. 1 is a block diagram of an electron microscope in accordance with an embodiment.

We now describe embodiments of the electron microscope. FIG. 1 presents a block diagram of an electron microscope 100. This electron microscope includes: an electron emitter 110-1, a housing 118-1 (such as a column), and a vacuum-generating mechanism 124. At least during operation of electron microscope 100, electron emitter 110-1 provides an electron beam 114-1. This electron emitter and the electron beam are at least partially enclosed within a cavity 122-1 defined by an inside wall 120-1 of housing 118-1. Furthermore, vacuum-generating mechanism 124, which is mechanically coupled to housing 118-1, provides a reduced pressure that is approximately greater than or equal to a medium vacuum in cavity 122-1 at least during the operation of electron microscope 100. For example, the medium vacuum may include a pressure approximately greater than $10^{-4}$ Torr (such as $10^{-3}$ Torr). Moreover, the reduced pressure may be less than or equal to atmospheric pressure, such as less than or equal to 1 Torr or less than or equal to $10^{-2}$ Torr. Thus, the reduced pressure may correspond to a soft or low vacuum. (Note that the medium vacuum around electron emitter 110-1 in electron microscope 100 is distinct from a configuration in which a sample is placed in an internal chamber that is at a higher pressure than the high vacuum that is typically used around the electron emitter in electron microscopes other than the electron microscope in this discussion.)

Electron emitter 110-1 may be selected based at least on two physical properties: it should emit electrons (and, more generally, charge carriers) when operated at the reduced pressure; and it should not evaporate or sublimate quickly under these conditions. The first physical property is determined by the work function of the electron-emitter material. The work function is the energy needed to liberate an electron from a surface. For a given material, the work function is typically a combination of bulk and surface properties. That is because many materials that are good emitters can easily become poor emitters depending on the vacuum conditions. Because the work function depends on the details of the very top monolayer of atoms on the surface of the electron emitter, it can be difficult to predict, a priori, how a given material will behave in a poor vacuum (such the soft or low vacuum during the operation of electron microscope 100). Note that the top layer of atoms can be the electron-emitter material, something adsorbed onto the surface, or an impurity from the bulk has segregated to the surface. Depending on the chemistry of the top few layers, these can either poison electron emission or improve it. As a practical matter, it is often necessary to measure the work function of an electron emitter under the conditions that it will be operated in order to know how well it will emit electrons.

The second of these physical properties determines the lifetime of electron emitter 110-1. If the bulk material evaporates quickly, as it does with tungsten or lanthanum hexaboride in an oxygen-containing environment (such as air or water vapor), then the electron emitter may either mechanically fail or may change its position within the electron optics of electron microscope 100. The former cannot be corrected. For example, if a tungsten wire in a so-called 'hairpin' configuration breaks, the electron emitter is dead. However, if the electron emitter has a so-called 'pointed rod' configuration, then as the rod evaporates it grows shorter, changing the electric fields that extract the electrons. This change in geometry can be somewhat compensated by adjusting the extraction voltage. Lanthanum hexaboride and tungsten Schottky emitters fall into this latter category.

Based on this discussion, to ensure a sufficient lifetime (such as 50-2000 hours) at the reduced pressure, electron emitter 110-1 may have an evaporation or sublimation rate that is significantly less than that of tungsten or lanthanum hexaboride at the reduced pressure in cavity 122-1, such as an evaporation or sublimation rate that is at least two orders of magnitude smaller. Note that a mounting or fixture that holds electron emitter 110-1 may include a variety of construction materials. (For example, electron emitter 110-1 may be held by a carbon support structure, which in turn is mechanically and electrically coupled to molybdenum contacts. During operation of electron emitter 110-1, electrical current may be passed through the carbon support via the molybdenum contacts, thereby heating electron emitter 110-1.) In the present discussion, electron emitter 110-1 refers to a material or materials that emit the electrons for electron beam 114-1. In some embodiments, electron emitter 110-1 is a ceramic, such as a carbide-based material that has a low oxidation rate even at high temperatures and atmospheric pressure. The oxides of many carbide-based materials are not typically volatile, and therefore the evaporation or sublimation of electron emitter 110-1 may be reduced or eliminated when at the reduced pressure during the operation of electron microscope 100. In particular, the oxide typically forms a protective layer over the carbide-based material, thereby inhibiting further oxidation (thus, the oxide may be self-limiting). Consequently, carbide-based materials usually exhibit 'parabolic kinetics,' in which the oxide is self-passivating and grows more and more slowing with time (for example, varying as the square root of time).

In some embodiments, electron emitter 110-1 may include a bulk or a thin-film outer coating of: hafnium carbide (HfC), hafnium dioxide, hafnium diboride, hafnium nitride, zirconium carbide, zirconium dioxide, zirconium diboride, tantalum carbide, tantalum diboride, tantalum nitride, rhenium, boron nitride, titanium carbide, niobium carbide, thorium dioxide and/or compounds that include two or more of these compounds (which may include non-stoichiometric compounds, such as $HfC_{0.98}$ or $HfC_{0.68}$). This electron-emitter material may be crystalline, polycrystalline or amorphous, and may include additional materials, such as silicon dioxide, cerium oxide (which is sometimes referred to as 'ceria'), etc., to improve mechanical and/or electrical properties. If a thin-film outer coating is used, a wide variety of materials may be used for the substrate. More generally, the electron emitter may include a material other than: tungsten, lanthanum diboride, lanthanum hexaboride, a carbon nanotube, another allotrope of carbon and/or cerium hexaboride.

Moreover, carbide-based materials, such as hafnium carbide or zirconium carbide, have been found to exhibit improved electron emission in environments that contain oxygen. Consequently, the reduced pressure during the operation of electron microscope 100 may not poison the surface and prevent emission by electron emitter 110-1.

In some embodiments, during the operation electron emitter 110-1 may be heated above ambient temperature, may be cooled below ambient temperature or may be at approximately ambient temperature. Note that electron emitter 110-1 may operate in a space-charge limited mode, a temperature-limited mode or somewhere in-between. Alternatively or additionally, electron emitter 110-1 may be a photo-emitter, in which electrons are emitted due to the photoelectric effect. Alternatively or additionally, electron emitter 110-1 may be a field emitter or a field-enhanced emitter, such as a Schottky emitter or a thermal field emitter.

Because electron emitter 110-1 has a significantly smaller evaporation or sublimation rate, the reduced pressure in cavity 122-1 at least during the operation of electron microscope 100 may be larger than that used in existing electron microscopes. Consequently, lower cost materials (such as those that are not compatible with high-vacuum systems) may be used in housing 118-1. For example, housing 118-1 may include plastic. Furthermore, vacuum-generating mechanism 124 may be simpler (for example, it may use a single pump as opposed to a multi-stage pumping system), may be more reliable, and may have lower cost than the vacuum-generating mechanisms in existing electron microscopes. For example, vacuum-generating mechanism 124 may include a medium-vacuum pump (such as a roughing pump, a sliding-vane rotary pump, a rotary-piston pump, a rotary-plunger pump, a roots pump, an absorption pump, a diaphragm pump, a drag pump and/or a scroll pump) instead of a high-vacuum pump (such as a turbo-molecular pump, a diffusion pump, an ion pump, a cryopump and/or a sublimation pump). Therefore, vacuum-generating mechanism 124 may be incapable of generating a vacuum that is better than the medium vaccuum. However, a wide variety of vacuum-generating mechanisms may be used in electron microscope 100, such as a getter pump or a manual vacuum-generating mechanism.

Upper bounds on the reduced pressure in cavity 122-1 may be determined based at least on electron scattering and/or arching. In particular, if the reduced pressure in cavity 122-1 is raised too high, a significant fraction of electrons will scatter from gas atoms before they hit sample 128. This may reduce the image contrast, thereby reducing the resolving power of electron microscope 100. Using a Monte Carlo model, electron scattering at low vacuum levels can be calculated. For example, at a pressure of $10^{-2}$ Torr (in air), an electron-beam energy of 15 kV, and a working distance of 10 cm, it is estimated that only 5% of electron beam 114-1 may be scattered by the gas. While this may result in a 5% loss of contrast, and a 2.5% decrease in signal-to-noise, the impact is insignificant.

Furthermore, if the reduced pressure in cavity 122-1 is increased too much, vacuum arcing may occur. The Paschen Curve specifies the minimum voltage needed to create an arc due to gas pressure. At a pressure of $10^{-2}$ Torr (in air), and an electrode separation of one inch, the gas breakdown voltage is close to 100 kV, which is well above the typical operating voltage of electron microscope 100. Consequently, electron microscope 100 may be operated at reduced pressures that are less than or equal to atmospheric pressure, such as less than or equal to 1 Torr.

Note that electron microscope 100 may include an optional positioning stage 126 (such as a bellows) that is mechanically coupled to housing 118-1, and which may or may not displace sample 128 relative to electron beam 114-1. (Thus, housing 118-1 may mechanically couple to a sample chamber such as cavity 122-1, optional positioning stage 126, or both, for example, via a proprietary mechanical interface.) This stage may be located outside of cavity 122-1, i.e., outside of the reduced-pressure region. In some embodiments, optional positioning stage 126 is removeable, for example, it may be located proximate to or as part of a door (not shown) to housing 118-1. Furthermore, electron microscope 100 may include control logic 130 that deactivates electron emitter 110-1 and/or vacuum-generating mechanism 124 during a standby operating mode, and that activates electron emitter 110-1 and/or vacuum-generating mechanism 124 during a normal operating mode. As described further below with reference to FIG. 3, this may be of use in a portable or hand-held embodiment of the electron microscope.

In some embodiments, electron emitter 110-1 includes an optional electrode 112-1 that forms electron beam 114-1. Furthermore, electron microscope 100 may include one or more optional electro-optical (EO) mechanism(s) 116 that is external to cavity 122-1, and which scans, deflects, focuses and/or stigmates electron beam 114-1. For example, optional electro-optical mechanisms 116 may include: a magnetic deflection mechanism, an electron lens, a stigmator, a deflector and/or an alignment coil. In addition, electron microscope 100 may include one or more detectors 132. These detectors may include secondary electron (SE), back-scattered electron (BSE) and/or in-lens detectors. Furthermore, detector(s) 132 may be located on the opposite side of the sample from electron emitter 110-1, in order to detect and image transmitted electrons, for example, as is the case in a transmission electron microscope (TEM).

Moreover, electron microscope 100 may be used in conjunction with another micro-analysis technique, such as that provided at least in part by optional micro-analysis mechanism 134 (which may be a source, a detector and/or an analyzer), and which may share some of the same components as electron microscope 100 (such as control logic 130, housing 118-1 or optional positioning stage 126). For example, the other micro-analysis technique may include: energy dispersive x-ray analysis, optical imaging, optical microscopy, optical fluorescence imaging or spectroscopy, wavelength dispersive spectroscopy, x-ray diffraction analysis, x-ray fluorescence and/or electron-beam backscattered diffraction. As described further below with reference to FIG. 5, in some embodiments the source for the other micro-analysis technique may involve electron beam 114-1.

Figure 2:
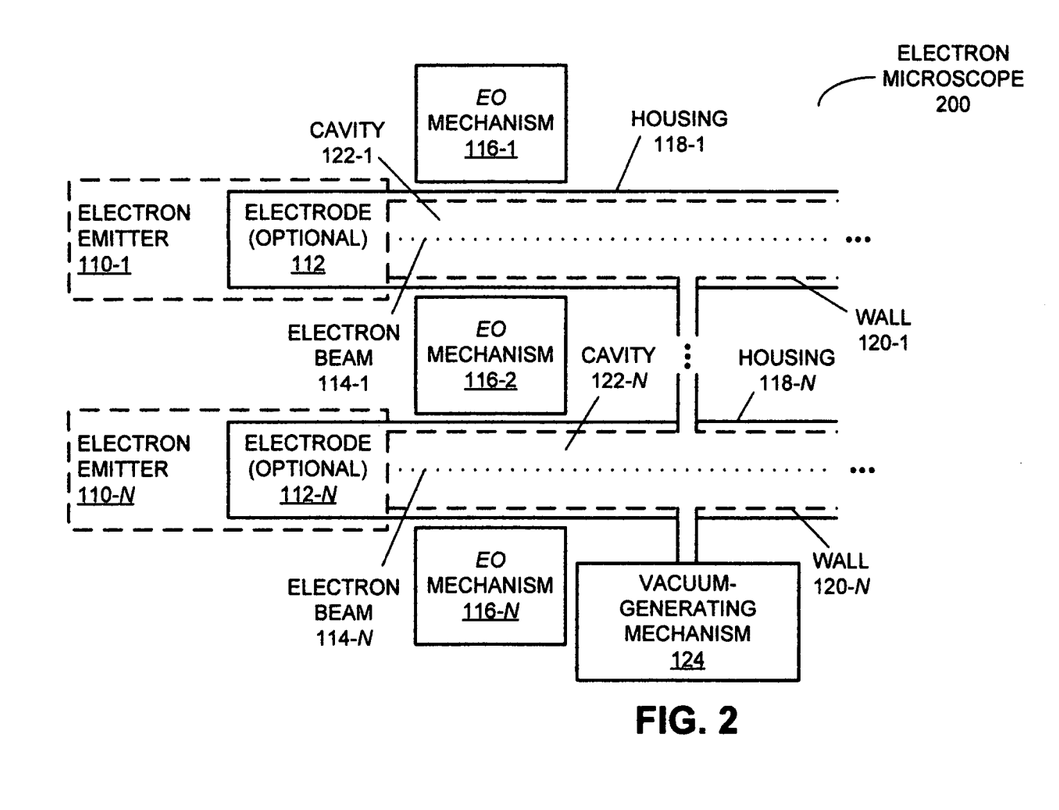
FIG. 2 is a block diagram of an electron microscope in accordance with an embodiment.

Note that while electron microscope 100 is shown with EO mechanism 116 external to housing 118-1, some or all of EO mechanism 116 may also be located within housing 118-1. Furthermore, while electron microscope 100 is illustrated with a single electron emitter 110-1, in other embodiments there may be multiple electron emitters and/or associated housings. This may facilitate a higher total electron-beam current, and thus faster imaging or writing using the electron microscope. This is shown in FIG. 2, which presents a block diagram of an electron microscope 200 with multiple electron emitters 110 and associated housings 118. Note that at least one or more of the electron emitters 110, optional electrodes 112, EO mechanism 116, and/or associated housings 118 (such as electron emitter 110-1 and/or housing 118-1) may be fabricated using a micro-electromechanical system (MEMS) fabrication technology.

Figure 3:
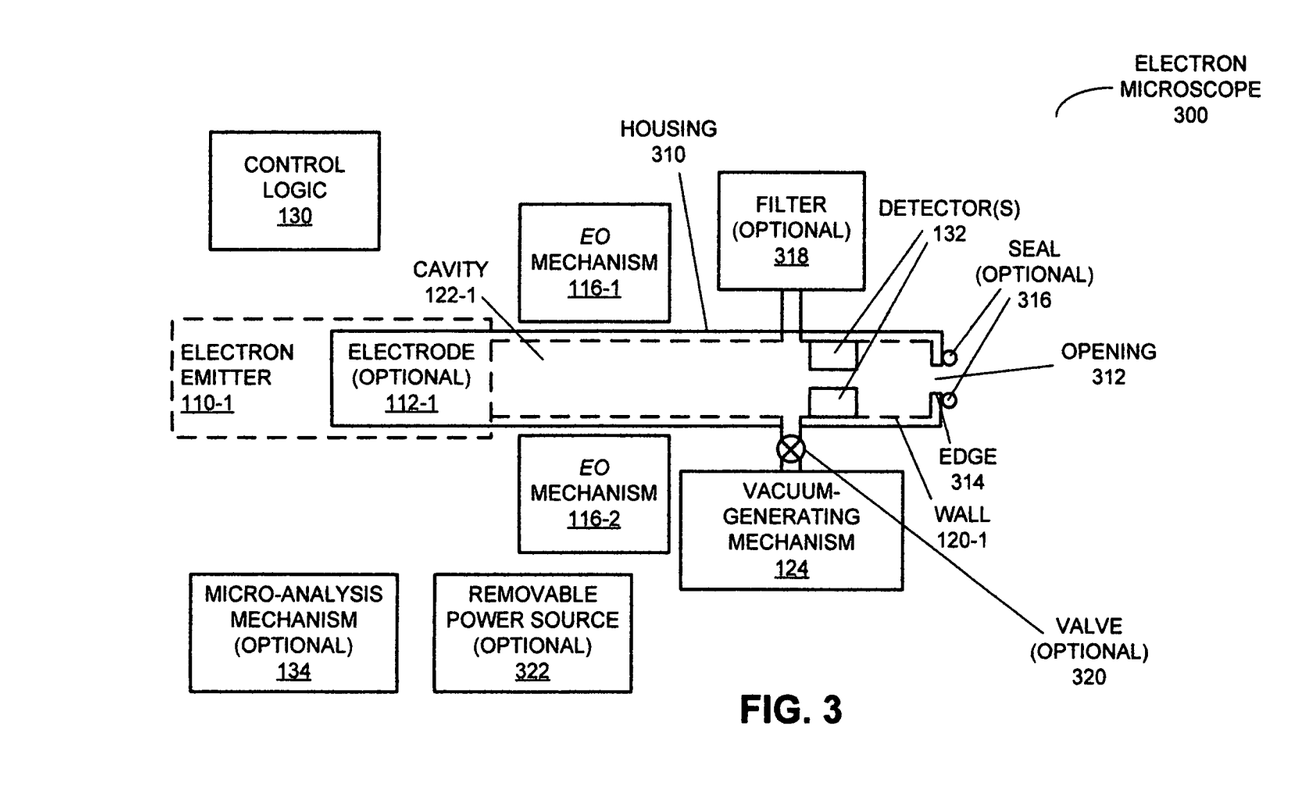
FIG. 3 is a block diagram of an electron microscope in accordance with an embodiment.

As noted previously, by operating at the reduced pressure, the size, weight and/or power consumption of the electron microscope can be reduced so that it may be portable or even hand-held. This is shown in FIG. 3, which presents a block diagram of an electron microscope 300. In this electron microscope, housing 310 has an opening 312 defined by an edge 314 of housing 310. However, in some embodiments, instead of opening 312, housing 310 includes an electron-permeable window in a region defined by edge 314.

Furthermore, electron microscope 300 may include an optional seal 316 (such as a sliding seal or a differentially-pumped airbearing) that is mechanically coupled to housing 310, which removeably mechanically couples housing 310 to a surface external to the electron microscope (as described further below with reference to FIG. 4). This optional seal may facilitate displacement of housing 310 along the surface when housing 310 is mechanically coupled to the surface. As described further below with reference to FIG. 7, this capability, in conjunction with or separately from the reduced size of electron microscope 300, may facilitate additional applications of electron microscope 300, such as sliding opening 312 over the surface while performing failure analysis of an object, such as an airplane wing.

In some embodiments, electron microscope 300 includes an optional filter 318 to remove particulate matter from the cavity at least during the operation of the electron microscope. For example, optional filter 318 may include an electrostatic filter. Note that optional filter 318 may be replaceable. In addition, in some embodiments electron microscope 300 includes an optional removable power source 322 (such as one or more batteries).

Figure 4:
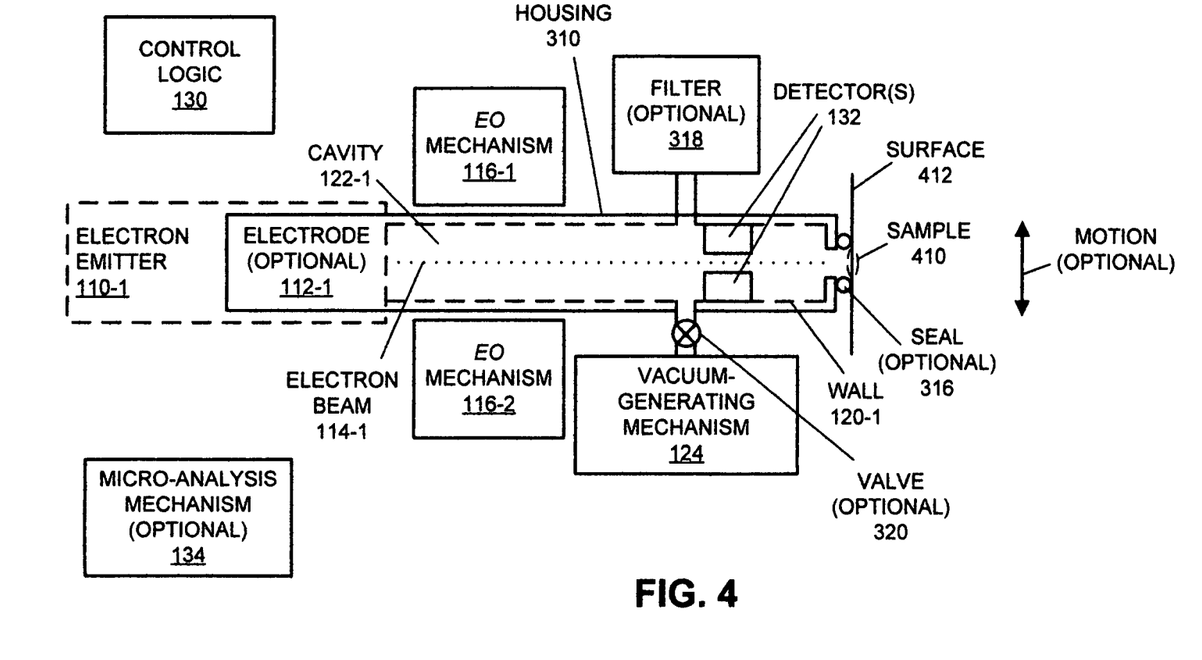
FIG. 4 is a drawing illustrating use of the electron microscope of FIG. 3 in accordance with an embodiment.

As shown in FIG. 4, which presents a drawing illustrating use of electron microscope 300 (FIG. 3), in an exemplary embodiment opening 312 may be positioned over a current sample 410 or a region to which electrons will be impinged upon (such as a portion of an object) during the standby operating mode, and optional seal 316 may provide at least a partial vacuum seal with a surface 412 surrounding sample 410. Then, control logic 130 may provide one or more signals that transition the electron microscope to the normal operating mode, thereby activating electron emitter 110-1 and/or vacuum-generating mechanism 124. In some embodiments, optional seal 316 allows the electron microscope to be displaced or moved along surface 412, thereby dynamically changing sample 410.

Furthermore, prior to operation, control logic 130 may provide one or more first signals to an optional valve 320 (or a relay or another device) in electron microscope 300 so that optional valve 320 selectively mechanically couples vacuum-generating mechanism 124 and housing 310 and/or the sample (such as sample 128 in FIG. 1). When this occurs, optional filter 318 may remove large particulate matter that entered cavity 122-1 when opening 312 was positioned over sample 410. (Similarly, when electron microscope 300 is transitioned to or in the standby operating mode, control logic 130 may provide the one or more second signals to optional valve 320 so that optional valve 320 selectively mechanically decouples vacuum-generating mechanism 124 and housing 310 and/or the sample, i.e., optional valve 320 may seal off vacuum-generating mechanism 124 from cavity 122-1.)

Figure 5:
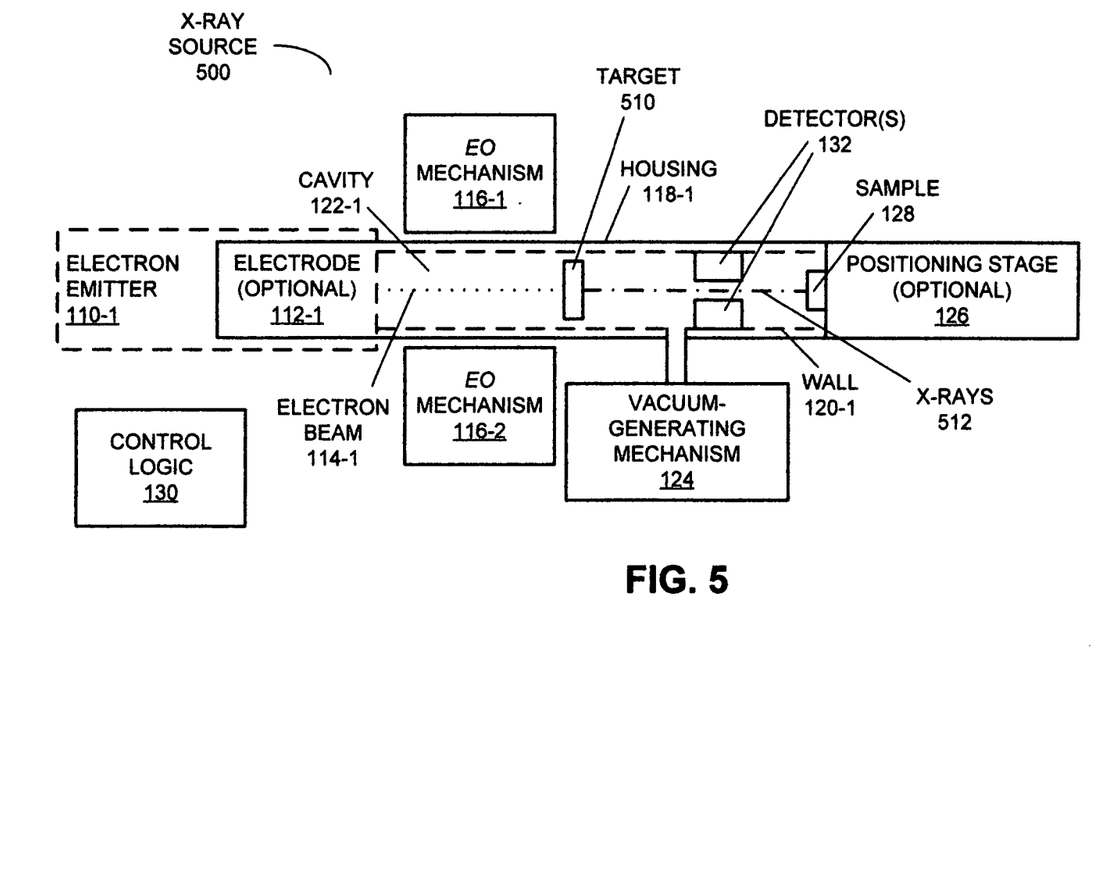
FIG. 5 is a block diagram of an x-ray source in accordance with an embodiment.

As noted previously, in some embodiments electron beam 114-1 may be used as a source in another micro-analysis technique. This is shown in FIG. 5, which presents a block diagram of an x-ray source 500. In particular, x-rays 512 are provided by x-ray source 500 by imaging electron beam 114-1 on a target 510.

The preceding embodiments of the electron microscope may be used in a wide variety of devices or systems, including those that uses an electron beam to image the sample, such as in: a scanning electron microscope (SEM), a transmission electron microscope (TEM), a scanning-transmission electron microscope (STEM), a low-energy electron microscope (LEEM), a secondary emission electron microscopes (SEEM), a mirror-electron microscope (MEM), and/or a variation on these types of microscopes. In addition, the preceding embodiments of the electron microscope may be used in displays (such as a television) and/or in a communication system (such as in a traveling wave tube).

While the present disclosure has been described in connection with specific embodiments, the claims are not limited to what is shown. Consequently, electron microscope 100 (FIG. 1), electron microscope 200 (FIG. 2), electron microscope 300 (FIG. 3), and/or x-ray source 500 may include fewer components or additional components. For example, in FIG. 1 there may be a vacuum valve between housing 118-1 and cavity 122-1 or optional positioning stage 126 that is either manually or automatically actuated, such as by control logic 130. Moreover, two or more components may be combined into a single component and/or a position of one or more components may be changed.

In some embodiments, electron emitter 110-1 (FIG. 1) includes an optional identifier 136 (FIG. 1), such as an integrated circuit, a register, a resistor, a fuse, or a radio-frequency identifier tag, that specifies a manufacturer of electron emitter 110-1 (FIG. 1), and thus a suitability for use in the embodiments of the electron microscope. Note that if optional identifier 136 (FIG. 1) is an integrated circuit, some of the functionality of electron microscope 100 (FIG. 1) may be implemented using this integrated circuit. In particular, optional identifier 136 (FIG. 1) may, at least in part, facilitate the implementation of an electron emitter with a regulated output. This may be of use in embodiments, such as electron microscope 200 (FIG. 2), in which there are multiple electron emitters 110 (FIG. 2). Alternatively or additionally, the interface between the housing 118-1 (FIG. 1) and optional positioning stage 126 (FIG. 1) may include an optional identifier, such as a mechanical or electrical register that specifies the manufacturer of optional positioning stage 126 (FIG. 1) or housing 118-1 (FIG. 1).

In the preceding embodiments, some components are shown directly connected to one another, while others are shown connected via intermediate components. In each instance the method of interconnection, or 'coupling,' establishes some desired electrical or mechanical functionality between two or more components in these devices. Such coupling may often be accomplished using a number of configurations, as will be understood by those of skill in the art, including adding additional intervening components and/or removing intervening components.

In some embodiments, functionality in these circuits, components, and devices is implemented in hardware and/or in software as is known in the art. For example, some or all of the functionality of these embodiments may be implemented in one or more: application-specific integrated circuit (ASICs), field-programmable gate array (FPGAs), and/or one or more digital signal processors (DSPs). Additionally, a portion of the software (such as core functionality in an embedded operating system that prevents damage to the electron microscope) may be closed to users other than a manufacturer or supplier of the electron microscope, while another portion of the software (such as an application programming interface) may be 'open' to these users. In this way, an open-source community may generate user applications, which are stored on one or more computer-readable media, and which execute on or in conjunction with the electron microscope.

Furthermore, circuits in the preceding embodiments may be implemented using bipolar, PMOS and/or NMOS gates or transistors, and signals in these embodiments may include digital signals that have approximately discrete values and/or analog signals that have continuous values. Additionally, the circuits may be single-ended or differential, and/or may be multiplexed or use multiple connections.

Figure 6:
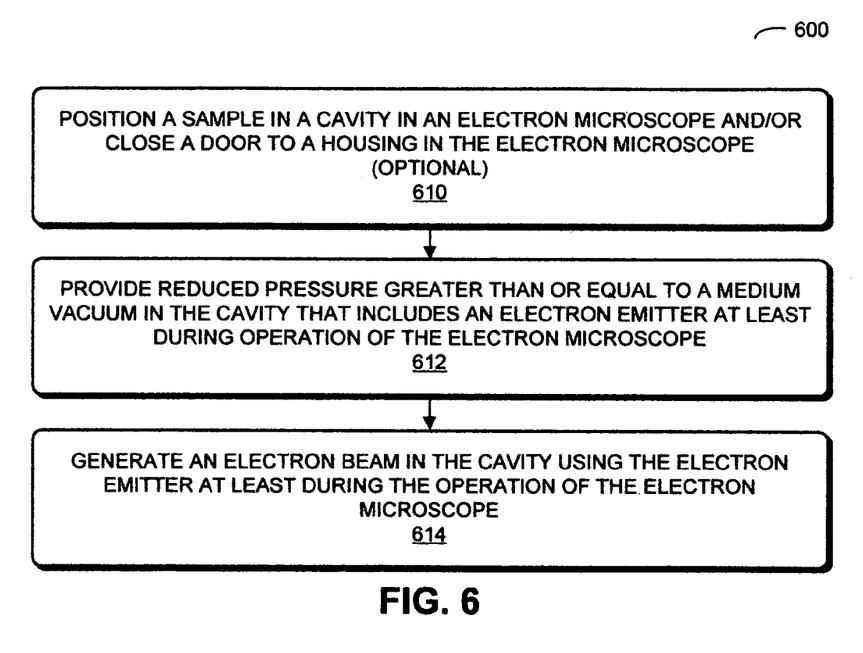
FIG. 6 is a flow diagram of a method for generating an electron beam for use in an electron microscope in accordance with an embodiment.

We now describe embodiments of methods of generating an electron beam in an electron microscope (such as the electron microscopes in FIGS. 1-3) and using the electron beam provided by the electron microscope. FIG. 6 presents a flow diagram of a method 600 for generating an electron beam for use in an electron microscope. During this method, the reduced pressure greater than or equal to the medium vacuum is provided in the cavity that includes the electron emitter at least during the operation of the electron microscope (operation 612). Then, the electron beam is generated in the cavity using the electron emitter at least during the operation of the electron microscope (operation 614).

In some embodiments, a sample is optionally positioned in the cavity in the electron microscope, and a door to the housing in the electron microscope may be optionally closed, prior to providing the reduced pressure (operation 610).

Figure 7:
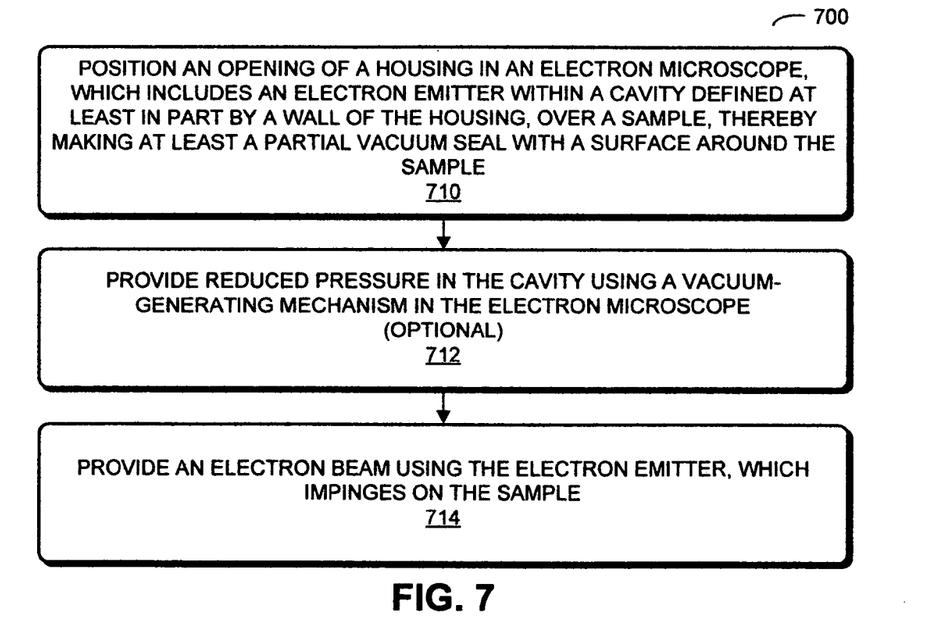
FIG. 7 is a flow diagram of a method for using an electron beam provided by an electron microscope in accordance with an embodiment.

As noted previously in the discussion of FIGS. 3 and 4, the electron microscope may include opening 312, which may facilitate additional uses and applications. This is shown in FIG. 7, which presents a flow diagram of a method 700 for using an electron microscope. During this method, the opening of the housing in the electron microscope, which includes the electron emitter within the cavity defined at least in part by the wall of the housing, is positioned over a sample (operation 710), thereby making at least a partial vacuum seal with a surface around the sample. Then, the vacuum-generating mechanism in the electron microscope optionally provides the reduced pressure in the cavity (operation 712). Next, the electron emitter provides the electron beam, which impinges on the sample (operation 714).

In some embodiments, methods 600 (FIG. 6) and/or 700 include additional or fewer operations. Moreover, the order of the operations may be changed and/or two or more operations may be combined into a single operation.

Thus, the embodiments of the electron microscope may facilitate a wide variety of uses and applications, including those that utilize a portable or hand-held electron microscope. For example, the electron beam provided by the preceding embodiments of the electron microscope may be used to irradiate an object, such as food or a parcel (or, more generally, an object that is shipped or mailed), thereby sterilizing the object, i.e., eliminating or reducing the presence of pathogens (such as bacteria or instances of a virus). Alternatively or additionally, the electron beam provided by the preceding embodiments of the electron microscope may be used to inspect an object (such as an airplane, a train, a bridge, or in failure analysis of a machine that is susceptible to stress fractures or cracks) or to review features on the object (which may be identified via another technique).

In some embodiments, the electron beam provided by the preceding embodiments of the electron microscope is used to image or irradiate at least a portion of an animal (such as a patient or a biological sample associated with the patient), thereby performing a diagnostic test or implementing a medical therapy. For example, opening 312 in housing 310 (FIG. 3) may make a partial vacuum seal with a body part of a human or an animal. Then, the electron beam may be used to image or perform spectroscopic analysis on a suspicious growth, such as a mole on a patient's skin. In some embodiments, results of these measurements may be analyzed by software and/or hardware that is in or associated with the electron microscope to assist a healthcare provider (such as a physician) in determining if the growth may be cancerous, in which case a biopsy may be performed.

More generally, the electron microscope may be used to study biological samples, such as samples on glass slide (which may include wet biologic or in-vivo samples). In particular, opening 312 (FIG. 3) may be positioned on the glass slide to form at least a partial vacuum seal, thereby allowing rapid electron-beam imaging and/or micro-analysis to be performed. As described previously with reference to FIG. 4, this approach and/or the use of optional seal 316 (FIG. 3) may allow the electron microscope to be used in automated or continuous processing of a wide variety of biological and non-biological samples.

In some embodiments, the electron beam provided by the preceding embodiments of the electron microscope is used to write patterns onto: a semiconductor wafer (such as silicon), a photo-mask, a MEMS substrate, a substrate for an optical device, and/or another substrate material during a lithographic process. For example, the photo-mask may include: a chromium-on-glass photo-mask, an alternating phase-shifting photo-mask, an attenuating phase-shifting photo-mask, and/or a multiple-exposure photo-mask (i.e., those where patterns printed using two or more photo-masks are combined to produce a desired pattern). Thus, the electron beam may be used to fabricate or repair the photo-mask. Furthermore, the lithographic process may include a direct-write lithographic process or a photo-lithographic process, including those with positive or negative photo-resist materials.

While the preceding examples illustrate several of the applications of the embodiments of the electron microscope, there are many additional applications, including in: the cosmetic industry, forensics, the pharmaceutical industry, biomedical applications, paper manufacturing, chemical manufacturing, steel manufacturing, the food industry, semiconductor fabrication, optics or photonics, and/or MEMS manufacturing and inspection. For example, the ability to operate at or above medium vacuum permits the elecron microscope to be integrated into process equipment, such as semiconductor fabrication equipment, including but not limited to: etching and deposition systems and/or metrology and inspection equipment. Alternatively or additionally, the electron microscope may be integrated with systems that utilize statistical process control (SPC) or factory automation. Furthermore, the low cost, reduced weight, reduced power consumption, reliability, ease of use, and/or portability of the preceding embodiments of the electron microscope may allow it to be more widely used by small businesses and/or in education, such as at schools.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. Therefore, the spirit and scope of the appended claims should not be limited to the foregoing description. Only those claims specifically reciting "means for" or "step for" should be construed in the manner required under the sixth paragraph of 35 U.S.C. §112.

What is claimed:

1. An electron microscope, comprising:
an electron emitter configured to provide an electron beam in response to heating associated with an electrical current passed through the electron emitter at least during operation of the electron microscope;
a housing having an inside wall that defines a cavity that at least partially encloses the electron emitter and the electron beam during the operation of the electron microscope; and
a vacuum-generating mechanism, mechanically coupled to the housing, configured to provide a reduced pressure greater than or equal to a medium vacuum in the cavity at least during the operation of the electron microscope when the electron beam is present, wherein the electron emitter is exposed to the reduced pressure while the electron emitter provides the electron beam,
wherein the electron emitter has an operating lifetime at the reduced pressure exceeding that of a tungsten emitter,
wherein the electron emitter is a ceramic that forms a surface-protective layer having a rate of a phase transition less than that of the tungsten emitter at the reduced pressure, and
wherein the phase transition is one of: evaporation and sublimation.

2. The electron microscope of claim 1, wherein the medium vacuum includes a pressure approximately greater than $10^{-4}$ Torr.

3. The electron microscope of claim 1, wherein the vacuum-generating mechanism includes a roughing pump.

4. The electron microscope of claim 1, wherein the vacuum-generating mechanism excludes a turbo-molecular pump or a diffusion pump.

5. The electron microscope of claim 1, wherein the electron emitter has an evaporation or sublimation rate that is significantly less than that of tungsten at the reduced pressure.

6. The electron microscope of claim 1, wherein the electron emitter includes hafnium carbide, hafnium dioxide, hafnium diboride, zirconium carbide, zirconium dioxide, zirconium diboride, tantalum carbide, or compounds that include two or more of these compounds.

7. The electron microscope of claim 1, wherein the electron emitter includes a material other than tungsten, lanthanum hexaboride, or cerium hexaboride.

8. The electron microscope of claim 1, further comprising a filter to remove particulate matter from the cavity at least during the operation of the electron microscope.

9. The electron microscope of claim 8, wherein the filter is replaceable.

10. The electron microscope of claim 8, wherein the filter includes an electrostatic filter.

11. The electron microscope of claim 1, wherein the electron microscope is portable.

12. The electron microscope of claim 11, wherein the electron microscope is hand held.

13. The electron microscope of claim 11, wherein the housing has an opening defined by an edge; and
wherein the electron microscope further comprises a seal, mechanically coupled to the housing, to removeably mechanically couple the housing to a surface external to the electron microscope.

14. The electron microscope of claim 13, wherein the seal facilitates displacement of the housing along the surface when the housing is mechanically coupled to the surface.

15. The electron microscope of claim 1, further comprising a positioning stage, mechanically coupled to the housing, to displace a sample relative to the electron beam.

16. The electron microscope of claim 1, further comprising control logic to deactivate the vacuum-generating mechanism during a standby operating mode and to activate the vacuum-generating mechanism during a normal operating mode.

17. The electron microscope of claim 1, further comprising:
a valve to selectively mechanically couple the vacuum-generating mechanism and the housing; and
control logic to provide first control signals to the valve so that the valve selectively mechanically decouples the vacuum-generating mechanism and the housing during a standby operating mode, and to provide second control signals to the valve so that the valve selectively mechanically couples the vacuum-generating mechanism and the housing during a normal operating mode.

18. The electron microscope of claim 1, wherein the electron microscope is used in conjunction with another microanalysis technique.

19. An electron microscope, comprising:
an electron emitter configured to provide an electron beam in response to heating associated with an electrical current passed through the electron emitter at least during operation of the electron microscope;
a housing having an opening defined by an edge, and having an inside wall that defines a cavity that at least partially encloses the electron emitter and the electron beam during the operation of the electron microscope;
a seal, mechanically coupled to the housing, configured to removeably mechanically couple the housing to a surface external to the electron microscope; and
a vacuum-generating mechanism, mechanically coupled to the housing, configured to provide a pressure less than atmospheric pressure and greater than or equal to a medium vacuum in the cavity at least during the operation of the electron microscope when the electron beam is present, wherein the electron emitter is exposed to the reduced pressure while the electron emitter provides the electron beam,
wherein the electron emitter has an operating lifetime at the reduced pressure exceeding that of a tungsten emitter,
wherein the electron emitter is a ceramic that forms a surface-protective layer with a phase-transition rate less than that of the tungsten emitter at the reduced pressure, and
wherein the phase transition is one of: evaporation and sublimation.

20. A method for generating an electron beam for use in an electron microscope, comprising:
providing a reduced pressure greater than or equal to a medium vacuum in a cavity that includes an electron emitter at least during operation of the electron microscope; and
generating the electron beam in the cavity using the electron emitter at least during the operation of the electron microscope when the electron beam is present, wherein the electron emitter is exposed to the reduced pressure while the electron emitter provides the electron beam;
wherein the electron emitter has an operating lifetime at the reduced pressure exceeding that of a tungsten emitter;
wherein the electron emitter is a ceramic that forms a surface-protective layer having a rate of a phase transition less than that of the tungsten emitter at the reduced pressure;
wherein the phase transition is one of evaporation and sublimation; and
wherein the electron emitter provides the electron beam in response to heating associated with an electrical current passed through the electron emitter at least during the operation of the electron microscope.

* * * * *